United States Patent
Wong

(10) Patent No.: US 6,958,516 B2
(45) Date of Patent: Oct. 25, 2005

(54) DISCRIMINATIVE SOI WITH OXIDE HOLES UNDERNEATH DC SOURCE/DRAIN

(75) Inventor: Robert C. Wong, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 23 days.

(21) Appl. No.: 10/754,320

(22) Filed: Jan. 8, 2004

(65) Prior Publication Data

US 2005/0151193 A1 Jul. 14, 2005

(51) Int. Cl.[7] .................................. H01L 27/01
(52) U.S. Cl. .................. 257/347; 257/349; 257/351; 257/352; 257/507
(58) Field of Search .................. 257/347–354, 257/507

(56) References Cited

U.S. PATENT DOCUMENTS

| | | | |
|---|---|---|---|
| 4,571,609 A | | 2/1986 | Hatano |
| 4,683,637 A | | 8/1987 | Varker et al. |
| 4,810,664 A | | 3/1989 | Kamins et al. |
| 5,382,818 A | * | 1/1995 | Pein ........................... 257/347 |
| 5,481,126 A | | 1/1996 | Subramanian et al. |
| 5,489,792 A | * | 2/1996 | Hu et al. ..................... 257/347 |
| 5,623,155 A | * | 4/1997 | Kerber et al. ............... 257/347 |
| 5,873,364 A | * | 2/1999 | Kopelowicz ................ 128/842 |
| 6,110,769 A | * | 8/2000 | Son ............................. 438/164 |
| 6,214,653 B1 | | 4/2001 | Chen et al. |
| 6,333,532 B1 | | 12/2001 | Davari et al. |
| 6,429,099 B1 | | 8/2002 | Christensen et al. |
| 6,531,375 B1 | | 3/2003 | Giewont et al. |
| 2001/0026990 A1 | | 10/2001 | Christensen et al. |
| 2002/0163041 A1 | | 11/2002 | Kim |
| 2002/0182787 A1 | | 12/2002 | Geum-jong |
| 2004/0262695 A1 | | 12/2004 | Steegan et al. |

FOREIGN PATENT DOCUMENTS

| | | | |
|---|---|---|---|
| JP | 359119723 A | * | 11/1984 |
| WO | WO 97/27628 | | 7/1997 |

* cited by examiner

Primary Examiner—Andy Huynh
(74) Attorney, Agent, or Firm—Scully, Scott, Murphy & Presser; William H. Steinberg

(57) ABSTRACT

A selective SOI structure having body contacts for all the devices while excluding the buried oxide that is directly underneath diffusions of DC nodes such as applied voltage Vdd, ground GND, reference voltage Vref, and other like DC nodes is provided. The selective SOI structure of the present invention can be used in ICs to enhance the performance of the circuit. The selective SOI structure of the present invention includes a silicon-on-insulator (SOI) substrate material comprising a top Si-containing layer having a plurality of SOI devices located thereon. The SOI devices are in contact with an underlying Si-containing substrate via a body contact region. A DC node diffusion region not containing an underlying buried oxide region is adjacent to one of the SOI devices.

22 Claims, 7 Drawing Sheets

DISCRIMINATIVE SOI WITH OXIDE HOLES UNDERNEATH DC SOURCE/DRAIN

FIELD OF THE INVENTION

The present invention relates to silicon-on-insulator (SOI) semiconductor integrated circuits (ICs), and more particularly to a selective SOI semiconductor structure that includes body contacts for all SOI devices present therein and a direct current (DC) node diffusion region in which no buried oxide is located directly beneath the DC node.

BACKGROUND OF THE INVENTION

In semiconductor processing, silicon-on-insulator (SOI) technology is becoming increasingly important since it permits the formation of high-speed integrated circuits. In SOI technology, an insulating material, e.g., a buried oxide, electrically isolates a top Si-containing layer from a bottom Si-containing substrate. The top Si-containing layer, which is oftentimes referred to in the art as the SOI layer, is generally the layer in which active devices such as transistors are formed. Devices formed using SOI technology offer many advantages over their bulk counterparts including, for example, higher performance, absence of latch-up, higher packing density and low voltage applications.

As SOI devices get smaller, the devices can suffer from a charge buildup in the body of the devices. This charge can cause a number of less than desirable effects including, for example, floating body effects. The floating body effects in SOI devices include a wide range of electrical behaviors resulting directly from the loss of control of the body charge state. Several examples of floating body effects are: (1) threshold voltage Vt that depends on the electrical history of the device (since the history of the device determines the body charge and effective back bias), (2) reduction of gate voltage control, (3) lowered snapback voltage, (4) degraded sub-Vt slope for static operation, (5) enhanced sub-Vt slope for dynamic operation, and (6) channel current overshoot. To ensure that specific devices do not suffer from these effects, a body contact is typically added as a method to drain off any charge in the body.

One known approach to provide body contacts is to cut out holes of the blanket buried oxide under the device's channel region so that the body in the device channel can be reached and biased thru the oxide opening. This approach provides a subtractive SOI substrate such as is shown, for example, in FIG. 1A. Specifically, FIG. 1A shows a metal oxide semiconductor field effect transistor (MOSFET) structure that includes a subtractive SOI substrate 10 having a patterned gate conductor 20 located atop a patterned gate dielectric 18. These patterned material layers are located atop the subtractive SOI substrate 10 that includes SOI channel region 16, source/drain regions 15, and buried oxide regions 14; the unlabeled region between the buried oxide regions 14 having boundaries defined by dotted lines represents the cut out buried oxide. The cut out oxide area serves as the body contact in the illustrated structure. Trench isolation region 12 is also shown in FIG. 1A.

Another approach is to start with the bulk technology and build a buried oxide underneath the Si source/drain. The intended buried oxide region is etched first and oxidized later. This approach provides an additive SOI substrate such as is shown, for example, in FIG. 1B. Specifically, FIG. 1B shows a MOSFET structure that includes an additive SOI substrate 11 having a patterned gate conductor 20 located atop a patterned gate dielectric 18. These patterned material layers are located atop the additive SOI substrate 11 that includes SOI channel region 16, source/drain regions 15, and buried oxide regions 14. Trench isolation region 12 is also shown in FIG. 1B. It is noted that in the structure shown in FIG. 1B the region between the buried oxide serves as the body contact of the field transistor device. Due to the processing of prior art additive SOI substrates, the Si plate tends to collapse during formation of the buried oxide.

In both SOI devices shown in FIGS. 1A and 1B, the active Si source/drain regions 15 are shielded from the Si substrate (not specifically shown) with a layer of buried oxide 14 underneath. A body contact is located beneath the channel region 16 and the underlying Si-containing substrate.

In actual IC designs, many source/drain regions are direct current (DC) nodes that do not switch at all. In particular, for the applied voltage VDD and ground GND regions buried oxides are actually undesirable. Moreover, the overall power bussing will miss the stabilization effects from the diffusion capacitance from the devices. For the individual circuits, the supply nodes will be bumped up and down more easily, and slow down the switching. Since the body contacts have to be at a distance away from the buried oxide, prior art layouts tend to be much larger than is necessary.

SUMMARY OF THE INVENTION

In view of the foregoing and other problems of prior art SOI technology, there is a need to provide a selective SOI structure having body contacts for all the devices while excluding the buried oxide that is directly underneath diffusions of DC nodes such as applied voltage Vdd, ground GND, reference voltage Vref, and other like DC nodes. The selective SOI structure of the present invention may be referred to as a discriminative SOI structure since oxide holes are present beneath the DC nodes, while oxide is present beneath the SOI devices active switching source/drain regions.

The selective SOI structure of the present invention can be used in ICs to enhance the performance of the circuit. Circuit performance enhancement up to 30% is possible utilizing the selective SOI structure of the present invention. Moreover, the selective SOI structures of the present invention use an additive process in which the collapse of the Si plate is avoided.

In broad terms, the selective SOI structure of the present invention comprises:

a silicon-on-insulator (SOI) substrate material comprising a top Si-containing layer having a plurality of SOI devices located thereon, said SOI devices are in contact with an underlying Si-containing substrate via a body contact region; and a DC node diffusion region adjacent to one of said SOI devices, said DC node diffusion region is in contact with said Si-containing substrate, i.e., the DC node diffusion region does not contain an underlying buried oxide region.

In accordance with the present invention, the DC node diffusion regions contain oxide holes, while the active source/drain regions of the SOI devices contain buried oxide material underneath. The selective SOI structure described above can be employed in various circuit design layouts to provide an IC that has enhanced circuit performance.

In the selective SOI structure described above, a semiconductor substrate for use in ICs is provided that includes at least an SOI substrate; a DC node diffusion region in said SOI substrate; and a buried insulator material within said SOI substrate, wherein said DC node diffusion region is in contact with an underlying Si-containing substrate of said SOI substrate, i.e., the DC node diffusion region does not include an underlying buried oxide. Instead, an oxide hole is located beneath the DC node diffusion region.

DETAILED DESCRIPTION OF THE INVENTION

Figure 1A:
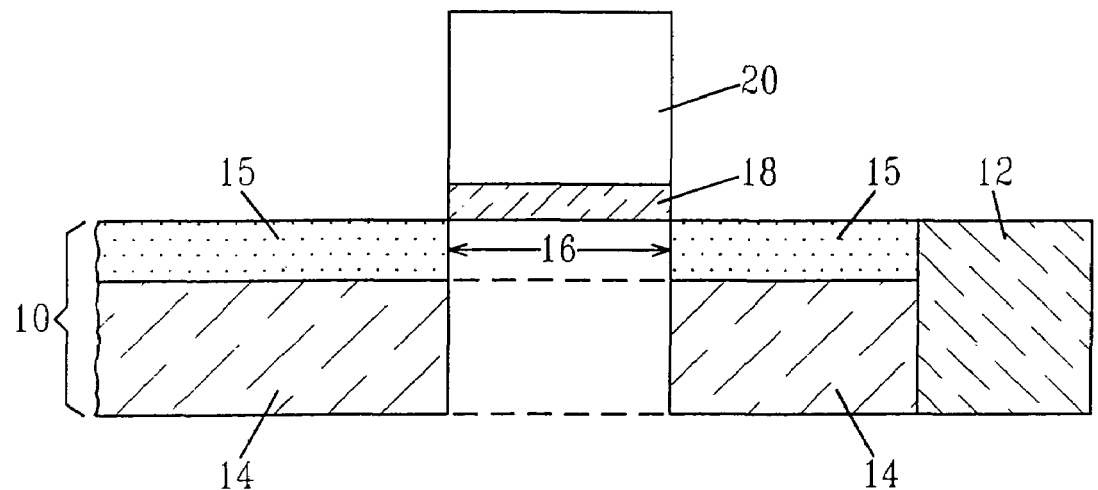
FIGS. 1A–1B are pictorial representations (through cross sectional views) illustrating a prior art structure containing a subtractive SOI substrate (FIG. 1A) and a prior art structure including an additive SOI substrate (FIG. 1B).
Figure 1B:
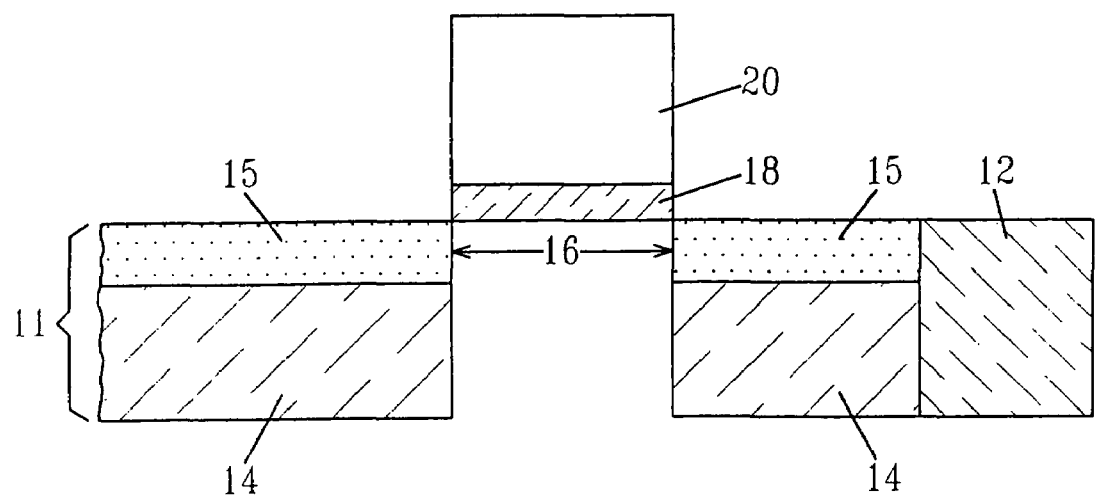

The present invention, which provides a selective SOI structure and the use thereof in various ICs, will now be described in greater detail by referring to the drawings that accompany the present application. It is noted that the drawings that accompany the present application are not drawn to scale; therefore the invention is not limited to any dimension that may be ascertained from the drawings.

Figure 2:
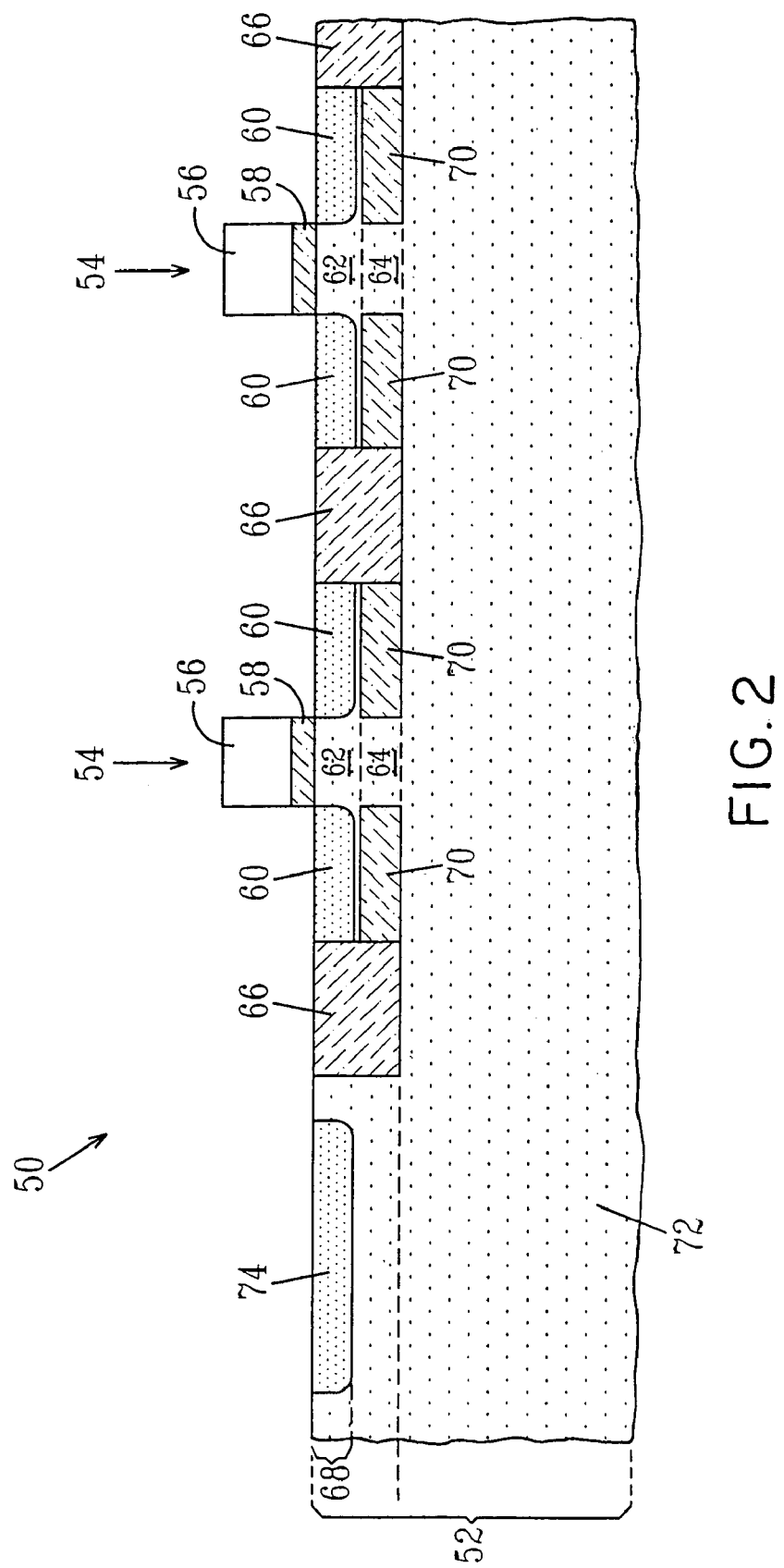
FIG. 2 is a pictorial representation (through a cross section view) illustrating the selective SOI semiconductor IC of the present invention.

Reference is first made to FIG. 2, which provides a simple cross sectional view of the selective SOI structure 50 of the present invention. The selective SOI structure 50 of the present invention comprises a silicon-on-insulator (SOI) substrate 52 having a plurality of semiconductor devices 54, such as MOSFETs, located on a surface of the SOI substrate 52. In FIG. 2, two semiconductor devices 54 are provided for illustrative purposes.

Each semiconductor devices 54 includes a patterned gate conductor 56 located on top of a patterned gate dielectric 58. Source/drain diffusion regions 60 are located within a top Si-containing layer 68 of the SOI substrate 52. A channel region 62 is located beneath each of the semiconductor devices 54. The channel region 62 is bounded on each side by the source/drain diffusion regions 60.

In accordance with the present invention, the selective SOI structure 50 includes a body contact region 64 that permits contact of the top Si-containing layer 68 of the SOI substrate 52 with an underlying Si-containing substrate 72. No buried insulator oxide 70 is located directly beneath the channel region 62 of each semiconductor device. The presence of the body contact regions 64 obviates the floating body effects mentioned in the background section of the present invention.

In addition to the above structural features, the structure of the present invention also includes at least one DC node diffusion region 74 that is located within the SOI substrate 52. As shown, the DC node diffusion region 74 lies to the periphery of the MOSFET devices 54 shown in FIG. 2.

In accordance with the present invention, no buried oxide 70 is located beneath the DC node diffusion region 74. Instead, the DC node diffusion region 74 is in contact with the bottom Si-containing substrate 72 of the SOI substrate 52, i.e., an oxide hole is present beneath the DC node diffusion region 74.

As indicated above, the SOI substrate 52 includes a top Si-containing layer 68, regions of buried oxide 70 and a bottom Si-containing substrate 72. The term "Si-containing" as used throughout the present application denotes a semiconductor material that includes at least silicon. Illustrative examples of such Si-containing materials include, but are not limited to: Si, SiGe, SiC, SiGeC, Si/Si, Si/SiC, and Si/SiGeC. The Si-containing material of layers 68 and 72 may be doped or undoped.

The top Si-containing layer 68 of the SOI substrate 52 typically has a thickness from about 50 to about 200 nm, with a thickness from about 75 to about 100 nm being more typical. The thickness of the bottom Si-containing substrate 72 is typically from about 700 to about 750 $\mu$m.

The buried oxide 70 employed in the present invention can be a crystalline or non-crystalline oxide. The buried oxide 70, which is located beneath the active source/drain diffusion regions 60 of each semiconductor device 54, typically has a thickness from about 30 to about 100 nm.

The SOI substrate 52 illustrated in FIG. 2 is an additive SOI substrate that is formed utilizing an additive SOI process, which is describe, for example, in co-assigned U.S. Ser. No. 10/604,102, filed Jun. 26, 2003, the entire content of the aforementioned U.S. Application is incorporated herein by reference. FIGS. 3A–3F, to be discussed in greater detail hereinbelow, provide a brief description of the process flow that can be employed in the present invention for forming the additive SOI substrate 52.

The semiconductor devices 54 are formed utilizing conventional complementary metal oxide semiconductor (CMOS) processing steps that are well known to those skilled in the art. For example, the semiconductor devices 54 can be formed by first forming a layer of gate dielectric 58 on an upper surface of the top Si-containing layer 68 of the SOI substrate 52. The term "gate dielectric" is used in the present invention to denote any insulating material, such as an oxide, nitride or oxynitride, that is typically employed as the gate dielectric of an MOSFET. The gate dielectric 58 is formed by a conventional deposition process such as, for example, chemical vapor deposition (CVD), plasma-assisted CVD, atomic layer deposition, physical vapor deposition or another like deposition process. Alternatively, the gate dielectric 58 can be formed by a thermal oxidation, nitridation or oxynitridation process. The thickness of the gate dielectric 58 is typically from about 1 to about 10 nm.

After formation of the gate dielectric, a gate conductor 56 is formed atop the gate dielectric. The gate conductor 56 may include any conductive material, including for example, doped polysilicon, conductive elemental metals, alloys of conductive elemental metals, silicides of conductive elemental metals, nitrides of conductive elemental metals, or any combination thereof. A diffusion barrier and/or a dielectric cap may be formed within or atop the gate conductor 56. Gate conductor 56 can be formed by a conventional deposition process such as, for example, CVD, plasma-assisted CVD, evaporation, sputtering, plating or another like deposition process. When polysilicon is employed, the polysilicon gate conductor is a doped material that can be formed in-situ, or by deposition and then ion implantation. The thickness of the gate conductor 56 is typically from about 100 to about 300 nm.

Following formation of the gate conductor, the gate conductor 56 and typically, the gate dielectric 58 are patterned by lithography and etching. Next, insulating spacers (not shown) are typically formed (by deposition and etching) on the exposed sidewalls of at least the patterned gate conductor 56. Following spacer formation, the source/drain diffusion regions 60 are formed into the top Si-containing layer 68 of the SOI substrate 52 by ion implantation and annealing. The source/drain regions 60 are formed into the top Si-containing layer 68 that has an underlying buried insulator material 70.

The annealing causes diffusion of the implanted dopants. The extent of the diffusion determines the length of the channel regions 62 in the top Si-containing layer 68 of the SOI substrate 52. The channel regions 62 are positioned such that a body contact region 64 is present below each of the channel regions 62 such that the semiconductor devices 54 do not exhibit the floating body effects.

It should be noted that the trench isolation regions 66 are typically formed into the SOI substrate 52 prior to formation of the semiconductor devices 54. The trench isolation regions are formed utilizing the additive SOI process, which will be described in greater detail hereinbelow.

At the same time as forming the source/drain diffusion regions 60 or at an earlier or later time than source/drain region 66 formation, the DC node diffusion region 74 is formed within the SOI substrate 52 at a location to the periphery of the semiconductor devices 54 and wherein no buried insulator material 70 is present. The DC node diffusion region 74 is formed by ion implantation and annealing. In accordance with the present invention, the DC node diffusion 74 contains no underlying buried oxide 70; therefore it is in contact with the bottom Si-containing substrate 72 of the SOI substrate 52. The DC node diffusion 74 may be a region in which a source voltage can be applied, a region in which a reference voltage can be applied, a ground region or any combination thereof such as, for example, a region in which a source voltage is applied and a region of ground. It is noted that the present invention may include a single DC node diffusion region 74 or a plurality of such regions located within the SOI substrate 52.

It is again emphasized that the selective SOI structure 50 shown in FIG. 2 includes SOI semiconductor devices 54 having source/drain 60 that are located atop regions of buried oxide 70. To avoid problems caused by floating body effects, the selective SOI structure 50 shown in FIG. 2 has body contact regions 64 beneath the MOSFET device channel 62. Moreover, in the inventive selective SOI structure 50, the DC node diffusion 74 does not include an underlying buried oxide 70 therefore it is in direct contact with the Si-containing substrate 72 of the SOI substrate 52.

Figure 3A:
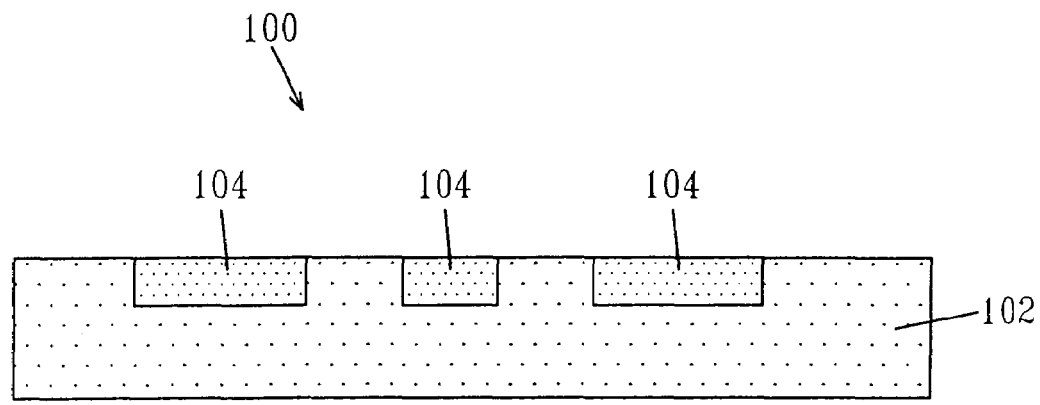
FIGS. 3A–3F are pictorial representations (through cross sectional views) illustrating basic processing steps that are employed in fabricating the selective SOI substrate of the present application.

The additive SOI substrate 52 employed in the present invention is fabricated utilizing an additive SOI process such as is described in the previous mentioned application that is incorporated herein by reference. The additive SOI process is exemplified briefly in FIGS. 3A–3F which are now described. FIG. 3A illustrates the initial structure 100 that is employed in fabricating the additive SOI substrate 52 of the present invention. As shown, the initial structure 100 includes a bulk Si-containing substrate 102 having n-doped regions 104 formed therein. The n-doped regions 104 are areas in which the buried insulator material 70 of the SOI substrate 52 will be subsequently formed.

The n-doped regions 104 are formed utilizing a masked ion implantation process. Annealing may follow the implantation to cause activation and diffusion of the n-type dopant. The bulk Si-containing substrate 102 will become the bottom Si-containing substrate 72 of the additive SOI substrate 52 shown in FIG. 2.

Figure 3B:
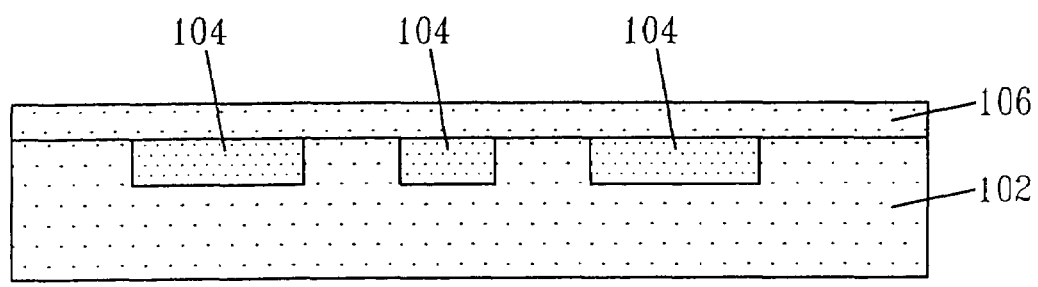

FIG. 3B shows the structure after a Si-containing layer 106 is formed atop the initial structure 100. The Si-containing layer 106, which serves as the top Si-containing layer 68 of the additive SOI substrate 52 shown in FIG. 2, is formed by an epitaxial growth process.

Figure 3C:
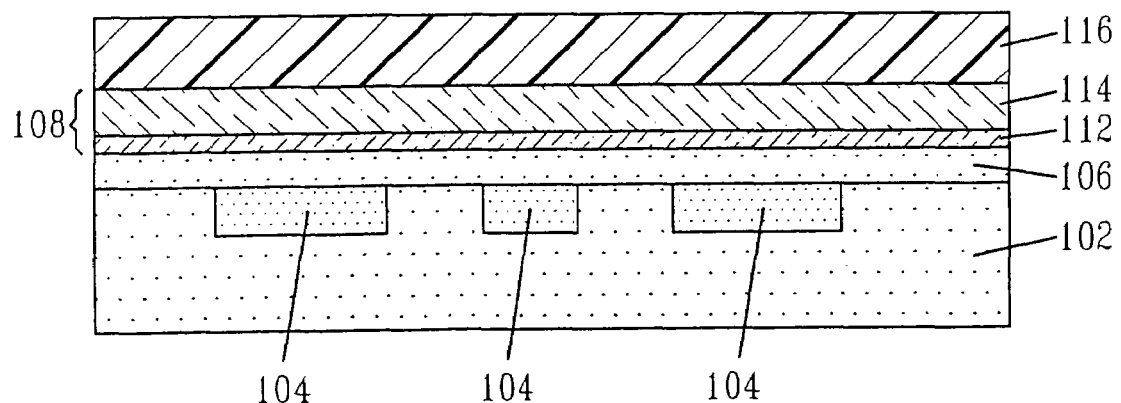

FIG. 3C shows the structure after forming a photoresist 116 and a pad stack 108 atop the Si-containing layer 106. The pad stack 108 comprising a nitride layer 112, and an oxide layer 114. Pad stack 108 is formed by deposition, a thermal process or a combination thereof.

Figure 3D:
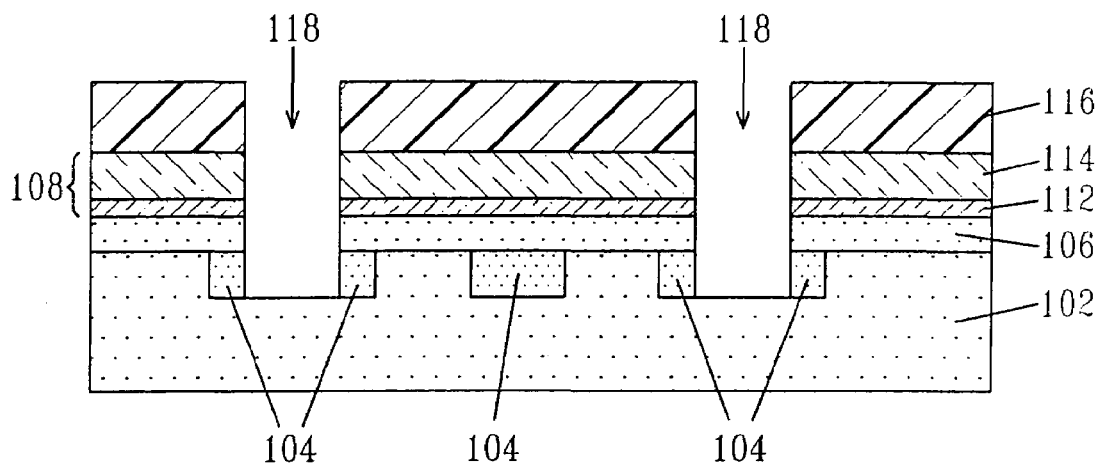

Next, and as shown in FIG. 3D, trench openings 118 are formed into the structure shown in FIG. 3C by first patterning the photoresist 116 by lithography and then transferring the pattern from the photoresist into the pad stack 108 by a first etching step. Following the first etching step, the patterned photoresist is removed and a second etching step is employed to transfer the pattern into the Si-containing layer 106 and then the n-doped regions 104. The second etching step stops atop a surface of the bulk Si-containing substrate 102 that lies beneath the n-doped regions 104.

Figure 3E:
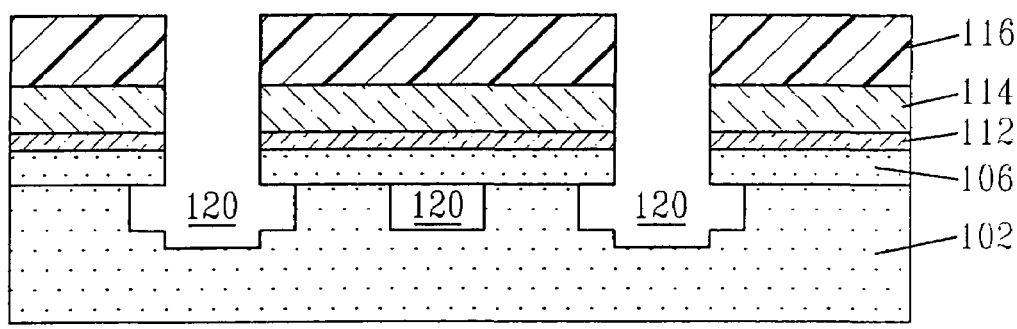

A lateral etch is then used to remove the remaining n-doped regions 104 providing the structure shown, for example, in FIG. 3E. Reference numeral 120 denotes the voids created by the lateral etch.

Figure 3F:
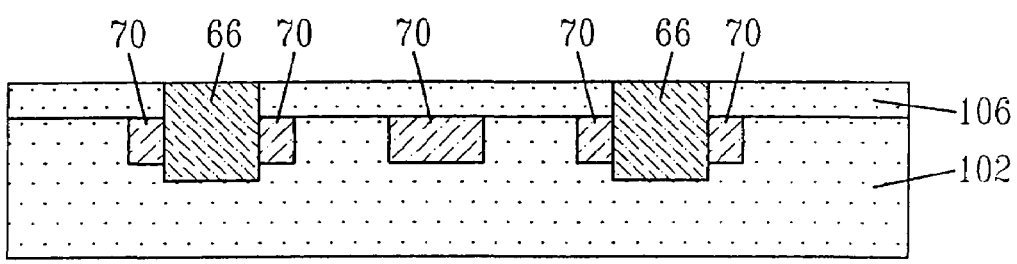

FIG. 3F shows the resultant additive substrate 52 after filling the voids with an oxide and removing the various layers atop layer 106. Note that the lateral etched and oxide filled areas become the buried insulator 70 of the structure shown in FIG. 2. The oxide within the vertical etched trench becomes the trench isolation regions 66 of the structure.

Figure 4A:
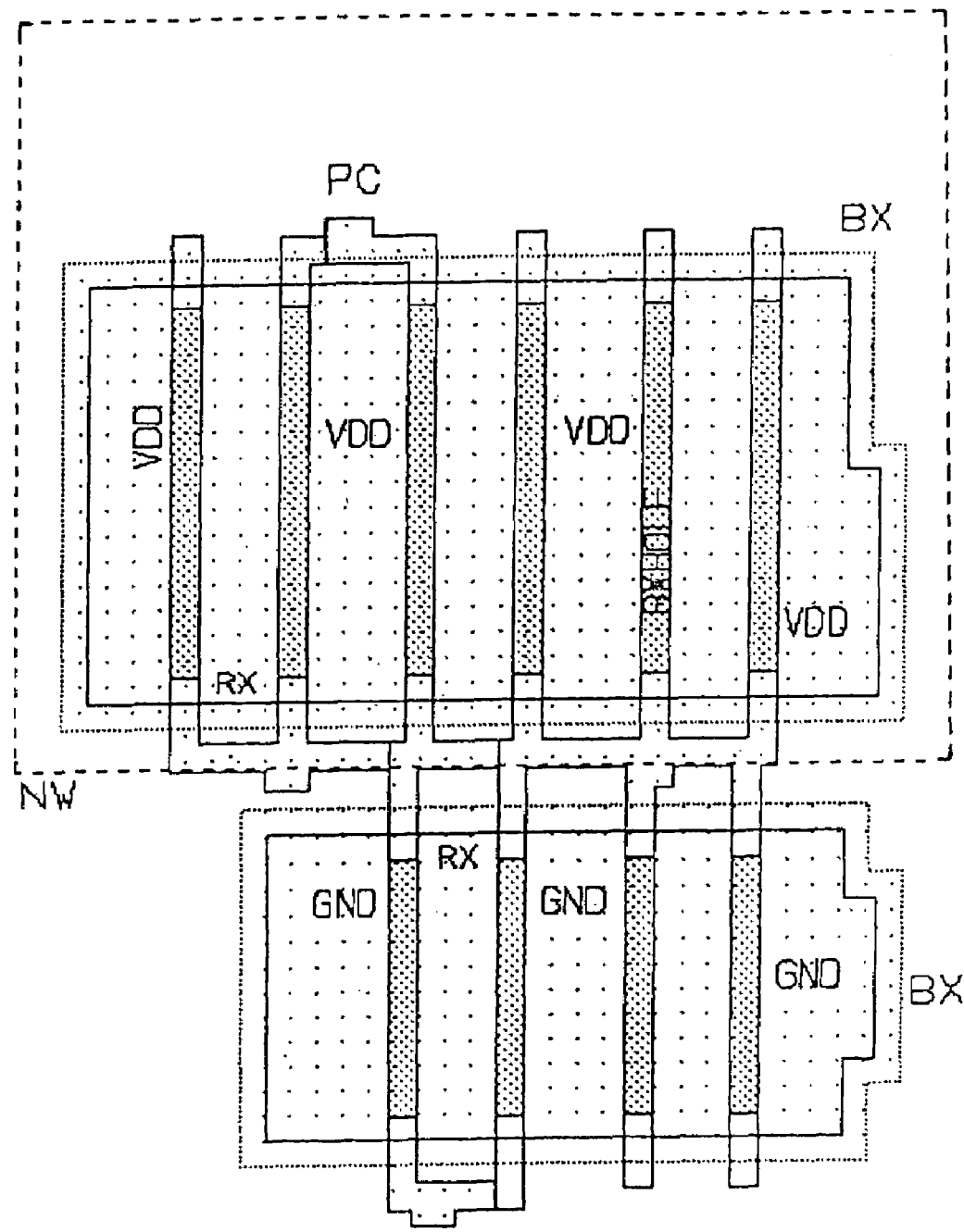
FIGS. 4A–4B are schematics showing complementary metal oxide semiconductor (CMOS) IC design layouts of the prior art (FIG. 4A) and the present invention (FIG. 4B).
Figure 4B:
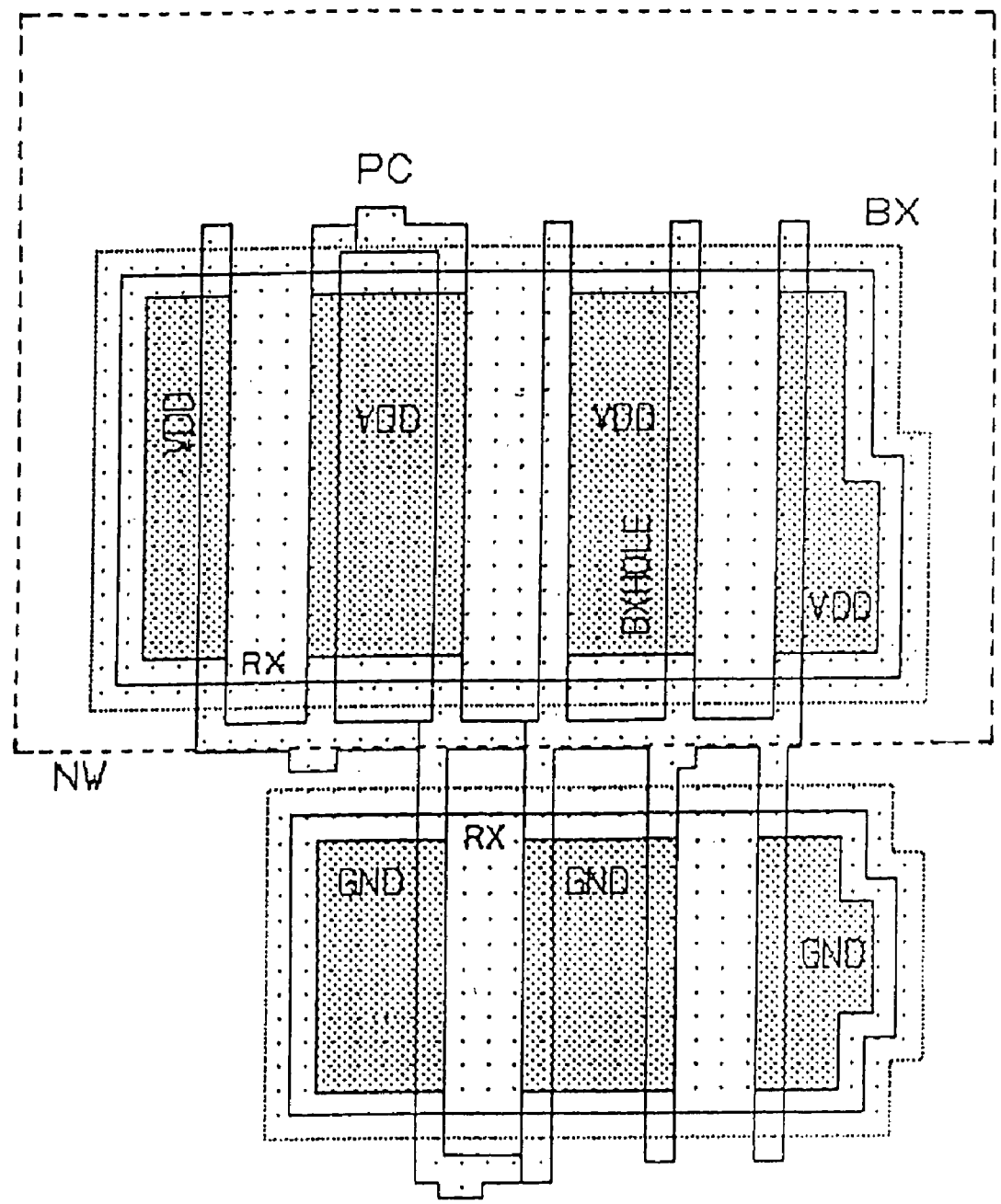

The selective SOI structure shown in FIG. 2 containing discriminative oxide holes underneath the DC node diffusion regions 74 can be used in various IC layouts to provide improved IC performance. FIG. 4A shows a prior art IC layout for a standard NAND gate of a standard selective SOI substrate, while FIG. 4B shows the inventive selective SOI structure in the same IC layout. In each drawings, PC denotes the polysilicon conductor that forms the gate of the FET devices, VDD denotes the applied potential, RX denotes the region of active silicon, BX denotes buried oxide, and BXHOLE denotes the buried oxide cut out.

In the prior art IC layout, BXHOLE is only cut out at the channel region. In the claimed invention, the BXHOLE is expanded into the supply diffusion regions as shown to add another 5 to 10% of performance to the design. The buried oxide ring around the RX boundary is mainly to enhance deep well isolation. For some embodiments, the N+ or P+spacing can be reduced to zero if they are covered by BX.

Figure 5:
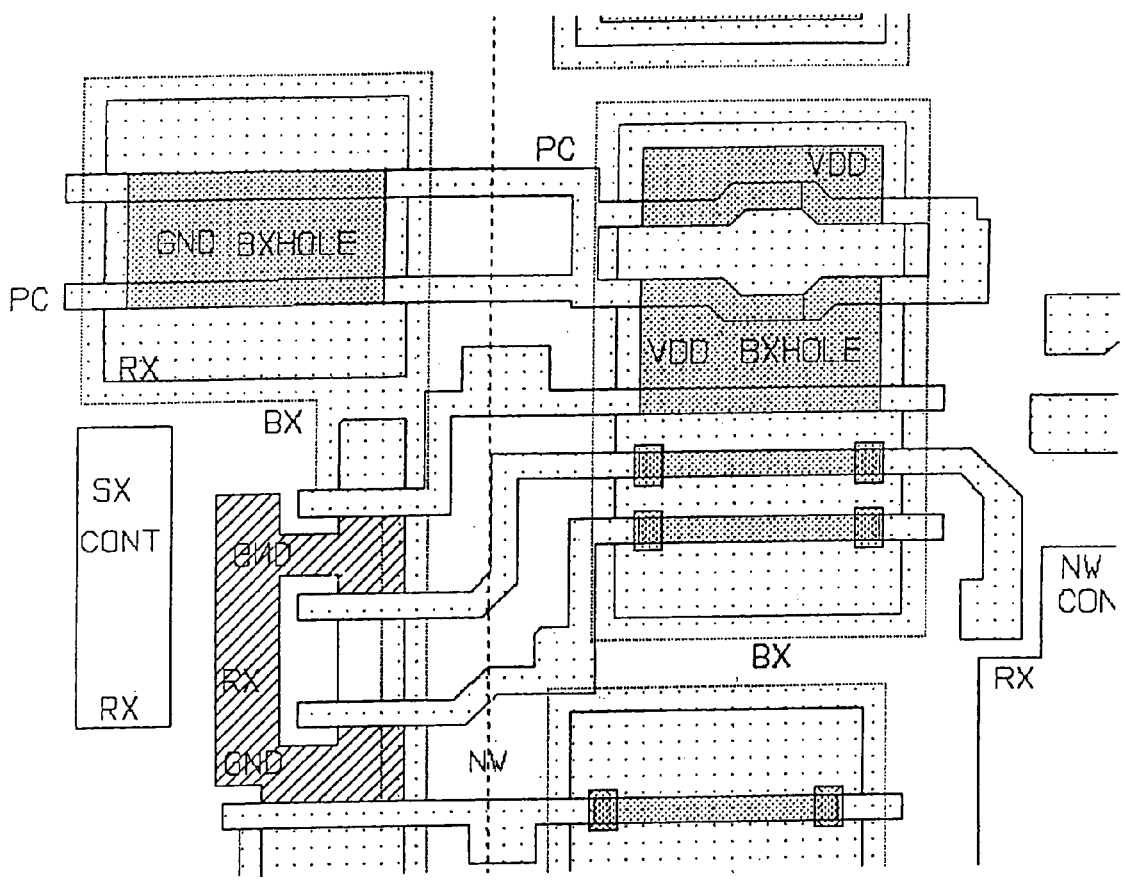
FIG. 5 is schematic showing a complementary metal oxide semiconductor (CMOS) IC design layout of the present invention.

For the additive SOI process, it is critical to avoid buried oxide under supply diffusion regions. On example of such an IC layout is shown in FIG. 5. At the lower left corner of FIG. 5, a piece of active Si is connecting to the GND supply to three NFETs.

In FIG. 5, GND BXHOLE and VDD BXHOLE are the DC non-switching nodes of the FET device source/drain regions, underwhich no oxide is formed. The regions without oxide provide the support to the hanging Si plates after the lateral etch. (See, FIG. 3E reference numeral 120). The other DC nodes labeled as VDD and GND serve the same supporting function before the actual underground oxide is formed.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

I claim:

1. A selective silicon-on-insulator (SOI) structure comprising:
    a silicon-on-insulator (SOI) substrate material comprising a top Si-containing layer having a plurality of SOI devices located thereon, said SOI devices are in contact with an underlying Si-containing substrate via a body contact region; and
    a DC node diffusion region adjacent to one of said SOI devices, said DC node diffusion region is located within bulk silicon without oxide underneath thereby the DC node diffusion region is in contact with said Si-containing substrate.

2. The selective SOI structure of claim 1 wherein said plurality of SOI devices comprise metal oxide semiconductor field effect transistors (MOSFETs).

3. The selective SOI structure of claim 2 wherein the MOSFETs comprise a gate dielectric and a gate conductor.

4. The selective SOI structure of claim 1 wherein said plurality of SOI devices are located atop a top Si-containing layer of said SOI substrate material.

5. The selective SOI structure of claim 4 wherein said plurality of SOI devices comprising active source/drain regions located with said top Si-containing layer.

6. The selective SOI structure of claim 5 wherein said active source/drain regions are located atop a buried oxide.

7. The selective SOI structure of claim 6 wherein said buried oxide is a lateral etched area located adjacent to a trench isolation region.

8. The selective SOI structure of claim 4 wherein said top Si-containing layer has a thickness from about 50 to about 200 nm.

9. Thee selective SOI structure of claim 1 wherein said DC node diffusion region comprises a region in which a source voltage can be applied, a region in which a reference voltage can be applied, a ground region or any combination.

10. The selective SOI structure of claim 1 wherein said SOI substrate is an additive SOI substrate having discriminative regions for forming said DC node diffusion region.

11. The selective SOI structure of claim 1 wherein said SOI substrate is comprised of a Si-containing material.

12. The selective SOI structure of claim 11 wherein said Si-containing material is selected from the group consisting of Si, SiGe, SiC, SiGeC, Si/Si, Si/SiC, and Si/SiGeC.

13. An integrated circuit comprising at least one selective silicon-on-insulator (SOI) structure said at least one selective SOI structure comprising a silicon-on-insulator (SO) substrate material comprising a top Si-containing layer having a plurality of SOI devices located thereon, said SOI devices are in contact with an underlying Si-containing substrate via a body contact region; and a DC node diffusion region adjacent to one of said SOI devices, said DC node diffusion region is located within bulk silicon without oxide underneath thereby the DC node diffusion region is in contact with said Si-containing substrate.

14. A semiconductor substrate comprising:
    an SOI substrate;
    a DC node diffusion region in said SOI substrate; and
    a buried oxide material within said SOI substrate, wherein said DC node diffusion region is located within bulk silicon without oxide underneath thereby the DC node diffusion region is in contact with an underlying Si-containing substrate of said SOI substrate.

15. The semiconductor substrate of claim 14 wherein said SOI substrate includes a top Si-containing layer.

16. The semiconductor substrate of claim 15 wherein the top Si-containing layer and the underlying Si-containing substrate are composed of a silicon semiconductor material selected from the group consisting of Si, SiGe, SiC, SiGeC, Si/Si, Si/SiC, and Si/SiGeC.

17. The semiconductor substrate of claim 15 wherein said top Si-containing layer has a thickness from about 50 to about 200 nm.

18. The semiconductor substrate of claim 14 wherein the buried oxide material is crystalline.

19. The semiconductor substrate of claim 14 wherein the buried oxide material is non-crystalline.

20. The semiconductor substrate of claim 14 wherein the buried oxide material has a thickness from about 30 to about 100 nm.

21. The semiconductor substrate of claim 14 further comprising at least one trench isolation region that is in contact with said buried oxide material.

22. The semiconductor substrate of claim 14 wherein said DC node diffusion region comprises a region in which a source voltage can be applied, a region in which a reference voltage can be applied, a ground region or any combination.

* * * * *